United States Patent
Matsumoto

(10) Patent No.: US 11,804,256 B2
(45) Date of Patent: *Oct. 31, 2023

(54) MEMORY SYSTEM

(71) Applicant: Kioxia Corporation, Tokyo (JP)

(72) Inventor: Hajime Matsumoto, Higashimurayama (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/870,880

(22) Filed: Jul. 22, 2022

(65) Prior Publication Data

US 2022/0358990 A1 Nov. 10, 2022

Related U.S. Application Data

(63) Continuation of application No. 17/205,239, filed on Mar. 18, 2021, now Pat. No. 11,430,501.

(30) Foreign Application Priority Data

Sep. 23, 2020 (JP) ................. 2020-158140

(51) Int. Cl.

| | |
|---|---|
| *G11C 5/14* | (2006.01) |
| *G11C 11/4074* | (2006.01) |
| *G11C 11/4076* | (2006.01) |
| *G06F 13/42* | (2006.01) |
| *G11C 5/06* | (2006.01) |

(Continued)

(52) U.S. Cl.
CPC ........ *G11C 11/4074* (2013.01); *G06F 13/409* (2013.01); *G06F 13/4221* (2013.01); *G11C 5/06* (2013.01); *G11C 11/4072* (2013.01); *G11C 11/4076* (2013.01)

(58) Field of Classification Search
CPC ..... G11C 11/4074; G11C 5/06; G06F 13/409; G06F 13/4221
See application file for complete search history.

(56) References Cited

U.S. PATENT DOCUMENTS

| | | | |
|---|---|---|---|
| 6,201,437 B1 | 3/2001 | Kono | |
| 9,639,291 B2* | 5/2017 | Matsumoto | ........... G06F 3/0616 |
| 10,175,898 B2* | 1/2019 | Matsumoto | ........ G11C 16/3495 |

(Continued)

OTHER PUBLICATIONS

"1.8V sideband, Power Loss Notification, USB 2.0 and higher power support", PCI-SIG Engineering Change Notice, Nov. 28, 2018, 36 pages.

*Primary Examiner* — Min Huang
(74) *Attorney, Agent, or Firm* — Oblon, McClelland, Maier & Neustadt, L.L.P.

(57) ABSTRACT

According to one embodiment, a memory system is disclosed. The system includes a nonvolatile memory, a controller which controls the nonvolatile memory and to which a first voltage is supplied, and a circuit to which first and second signals from a host device are input, or the first signal is not input and the second signal is input from the host device, when the memory system is connected to the host device. The circuit converts a second voltage of the second signal into the first voltage when the first and second signal have the second voltage and the second voltage is lower than the first voltage, and does not convert a voltage of the second signal into the first voltage when the first signal is not input and the voltage of the second signal is the first voltage.

11 Claims, 6 Drawing Sheets

(51) Int. Cl.
  *G06F 13/40* (2006.01)
  *G11C 11/4072* (2006.01)

(56) References Cited

U.S. PATENT DOCUMENTS

| | | | |
|---|---|---|---|
| 10,242,719 B2 * | 3/2019 | Doo | G06F 1/3275 |
| 10,679,711 B2 * | 6/2020 | Matsumoto | G11C 29/028 |
| 11,430,501 B2 * | 8/2022 | Matsumoto | G11C 5/06 |
| 2016/0070502 A1 * | 3/2016 | Matsumoto | G06F 3/0634 |
| | | | 711/103 |
| 2016/0070562 A1 | 3/2016 | Matsumoto | |
| 2019/0222213 A1 | 7/2019 | Rudolff | |
| 2020/0327920 A1 | 10/2020 | Fujimoto | |

* cited by examiner

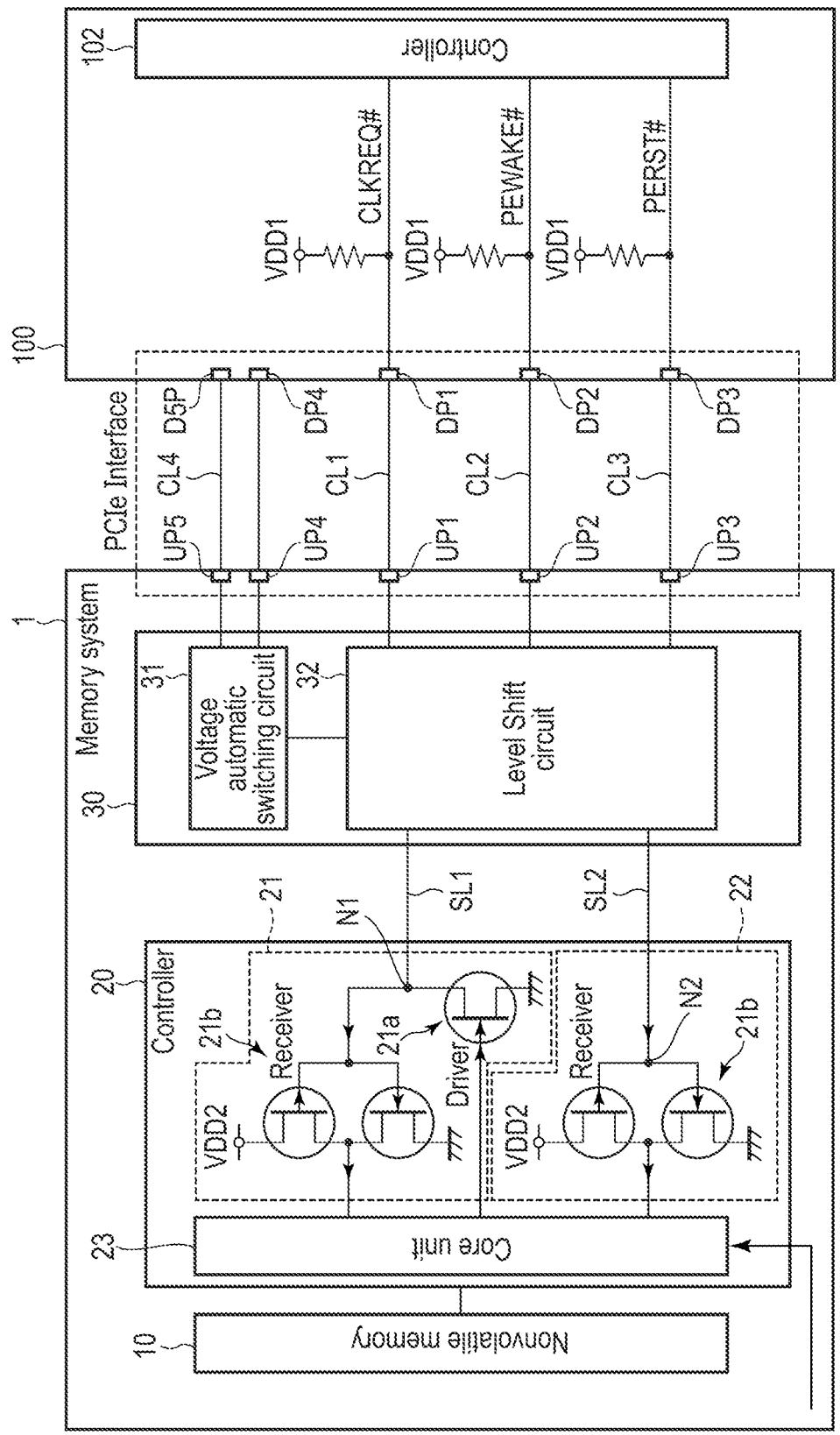
F.I.G. 2

| Pin | Signal | Signal | Pin |
|---|---|---|---|
| 74 | 3.3V | GND | 75 |
| 72 | 3.3V | VIO CFG (I) | 73 |
| 70 | 3.3V | GND | 71 |
| 68 | SUSCLK(32kHz) (O)(0/1.8/3.3V) | PEDET (NC-PCIe/GND-SATA) | 69 |
|  | CONNECTOR KEY M | NC | 67 |
|  | CONNECTOR KEY M | CONNECTOR KEY M |  |
|  | CONNECTOR KEY M | CONNECTOR KEY M |  |
|  | CONNECTOR KEY M | CONNECTOR KEY M |  |
| 58 | NC | CONNECTOR KEY M |  |
| 57 | NC | GND | 57 |
| 55 | PEWAKE# (I/O)(0/1.8/3.3V) or NC | REFCLKp | 55 |
| 52 | CLKREQ# (I/O)(0/1.8/3.3V) or NC | REFCLKn | 53 |
| 50 | PERST# (O)(0/1.8/3.3V) or NC | GND | 51 |
| 48 | NC | PETp0/SATA-A+ | 49 |
| 46 | NC | PETn0/SATA-A- | 47 |
| 44 | ALERT# (I)(0/1.8V) | GND | 45 |
| 42 | SMB_DATA (I/O)(0/1.8V) | PERp0/SATA-B- | 43 |
| 40 | SMB_CLK (I/O)(0/1.8V) | PERn0/SATA-B+ | 41 |
| 38 | DEVSLP (O) (SATA) or GND (USB) | GND | 39 |
| 36 | USB D- or NC | PETp1 | 37 |
| 34 | USB D+ or NC | PETn1 | 35 |
| 32 | NC or GND (USB) | GND | 33 |
| 30 | PLA S3# (I)(0/3.3V) or NC | PERp1 | 31 |
| 28 | NC | PERn1 | 29 |
| 26 | NC | GND | 27 |
| 24 | NC | PETp2 | 25 |
| 22 | VIO 1.8V | PETn2 | 23 |
| 20 | NC | GND | 21 |
| 18 | 3.3V | PERp2 | 19 |
| 16 | 3.3V | PERn2 | 17 |
| 14 | 3.3V | GND | 15 |
| 12 | 3.3V | PETp3 | 13 |
| 10 | DAS/DSS# (I/O)/LED_1#(0/3.3V) | PETn3 | 11 |
| 8 | PLN# (O)(0/1.8/3.3V) or NC | GND | 9 |
| 6 | PWRDIS (O)(0/1.8/3.3V) or NC | PERp3 | 7 |
| 4 | 3.3V | PERn3 | 5 |
| 2 | 3.3V | GND | 3 |
|  |  | GND | 1 |

FIG. 3

MEMORY SYSTEM

CROSS-REFERENCE TO RELATED APPLICATIONS

This application is a continuation of U.S. application Ser. No. 17/205,239, filed on Mar. 18, 2021, which is based upon and claims the benefit of priority from Japanese Patent Application No. 2020-158140, filed Sep. 23, 2020, the entire contents of which are incorporated herein by reference.

FIELD

Embodiments described herein relate generally to a memory system.

BACKGROUND

As one of memory systems, a solid state drive (SSD) comprising a NAND flash memory is known. The SSD is connected to, for example, a host device such as a personal computer or a server. While the SSD is connected to the host device, signal transmission and reception between the SSD and the host device is performed in conformity with, for example, a PCI Express (registered trademark) (PCIe) interface standard which is one of interface standards.

BRIEF DESCRIPTION OF THE DRAWINGS

FIG. 2 is a block diagram showing the configuration of a memory system according to one embodiment.

FIG. 3 is a table showing an example of pin arrangement of a connector of the memory system according to one embodiment.

DETAILED DESCRIPTION

Figure 1A:
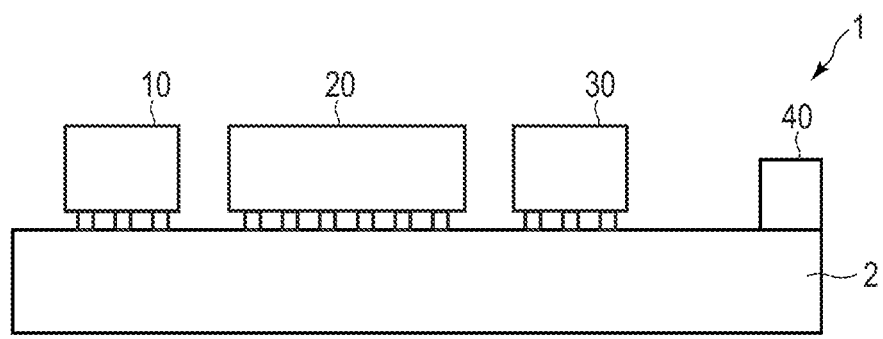
FIGS. 1A and 1B are illustrations showing the configuration of a memory system according to one embodiment.

In general, according to one embodiment, a memory system connectable to a host device is disclosed. The memory system comprises a nonvolatile memory; a controller which controls the nonvolatile memory and to which a first voltage is supplied; and a circuit to which a first signal and a second signal from the host device are input, or the first signal is not input and the second signal is input from the host device, when the memory system is connected to the host device. The circuit converts a second voltage of the second signal into the first voltage when the first signal and the second signal have the second voltage and the second voltage is lower than the first voltage. The circuit does not convert a voltage of the second signal into the first voltage when the first signal is not input and the voltage of the second signal is the first voltage.

Embodiments will be described hereinafter with reference to the accompanying drawings. The drawings are schematic or conceptual. In the drawings, the same or corresponding portions are denoted by the same reference numbers. In some cases, in order make the drawings simpler, the same or corresponding portions may not be denoted by reference numbers.

Figure 1B:
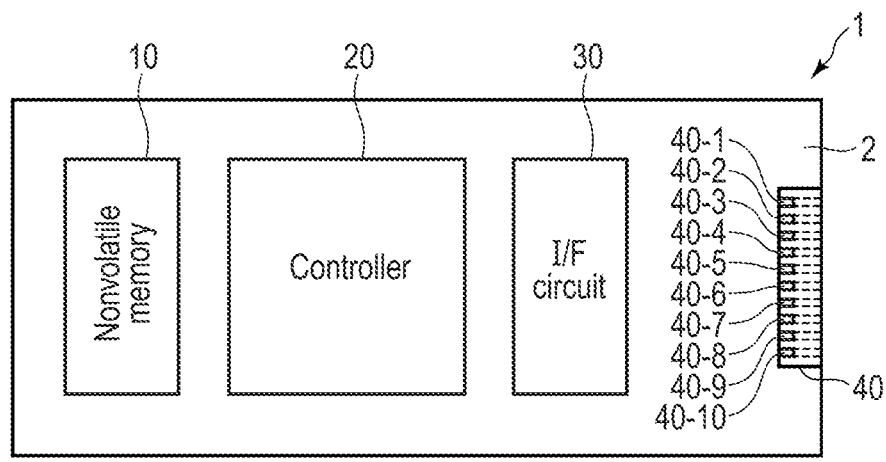

FIG. 1A is a side view schematically showing an example of the external configuration of a memory system 1, and FIG. 1B is a top view schematically showing an example of the external configuration of the memory system 1. FIG. 2 is a block diagram showing the memory system 1 and a host device 100 which are connected together.

The memory system 1 is, for example, a nonvolatile storage device such as an SSD, a USB memory, an SD card, a hard disk drive or a hybrid hard disk drive.

The host device 100 is, for example, an information processing device such as a personal computer or a server, a tester device, a manufacturing device, an image capturing device such as a still camera or a video camera, a portable terminal such as a tablet computer or a smartphone, a game console, or a car navigation system (in-car terminal).

A case where the memory system 1 is an SSD, the host device 100 is a personal computer, and signal transmission and reception between the memory system 1 and the host device 100 is performed in conformity with a PCIe standard will be described below.

As shown in FIGS. 1A and 1B, the memory system 1 comprises a printed circuit board 2, a nonvolatile memory 10, a controller 20, an interface circuit 30 and a connector 40.

The printed circuit board 2 comprises a first main surface 2a and a second main surface 2b. The second main surface 2b is a main surface on an opposite side to the first main surface 2a. The nonvolatile memory 10, the controller 20 and the connector 40 are disposed on the first main surface 2a.

The nonvolatile memory 10 includes a NAND flash memory and is mounted on the main surface 2a of the printed circuit board 2 in a package form. The nonvolatile memory 10 is mounted by, for example, a ball grid array (BGA) method.

The interface circuit 30 conforms to the PCIe standard, and includes a voltage automatic switching circuit 31 and a level shift circuit 32 connected to it (FIG. 2).

The controller 20 is mounted on the main surface 2a of the printed circuit board 2 in a package form. The controller 20 is mounted by, for example, the BGA method. For example, the controller 20 controls the nonvolatile memory 10.

The connector 40 has a shape conforming to M.2 which is one of form factors, and is composed as an edge connector. The connector 40 includes a plurality of pins 40-1 to 40-10. FIG. 3 is a table showing an example of the pin arrangement of the connector 40. Although the number of pins is 75 in the example of FIG. 3, in order to make the illustration simpler, the number of pins is 10 in FIG. 1B. The pins 40-1 to 40-10 of the connector 40 are connected to the interface circuit 30 and the controller 20 via board lines (not shown) in the printed circuit board 2.

The connector 40 constitutes a plurality of ports UP1, UP2, UP3, UP4 and UP5 (FIG. 2). A different pin of the connector 40 is allocated to each of the ports UP1, UP2, UP3, UP4 and UP5. More than one pin is allocated to each of the ports UP1, UP2, UP3, UP4 and UP5. The ports UP1, UP2 and UP3 are connected to the level shift circuit 32. The ports UP4 and UP5 are connected to the voltage automatic switching circuit 31.

The host device 100 includes a controller 102 and a connector (not shown) (FIG. 2). The connector constitutes a plurality of ports DP1, DP2, DP3, DP4 and DP5. A different pin of the connector is allocated to each of the ports DP1, DP2, DP3, DP4 and DP5. A logic signal is supplied from the controller 102 to each of the ports DP1, DP2, DP3, DP4 and DP5. For example, a clock request signal CLKREQ #is supplied from the controller 102 to the port DP1, a wakeup signal PEWAKE #is supplied from the controller 102 to the port DP2, a reset signal PERST #is supplied from the controller 102 to the port DP3, and a VIO 1.8 V signal is supplied from the controller 102 to the port DP4. The sign "#" indicates an active low signal.

Communication lines CL1, CL2, CL3 and CL4 are connected to the ports UP1, UP2, UP3 and UP4 of the connector 40, respectively. The ports UP1, UP2, UP3 and UP4 are connected to the ports DP1, DP2, DP3 and DP4 of the host device 100 via the communication lines CL1, CL2, CL3 and CL4. As a result, the memory system 1 and the host device 100 are connected together.

The ports UP1 to UP4 of the memory system 1, the communication lines CL1 to CL4 (a communication line group CL), and the ports DP1 to DP4 of the host device 100 constitute a PCIe interface 4 between the memory system 1 and the host device 100. Note that another interface such as a low-speed interface or a power supply interface may be composed between the memory system 1 and the host device 100.

The memory system 1 receives a control signal (command) from the host device 100 via the PCIe interface 4 and performs a control operation according to the received command. In addition, the memory system 1 transmits a control signal (request) to the host device 100 via the PCIe interface 4.

The controller 20 includes I/O circuits 21 and 22 and a core unit 23. The I/O circuit 21 includes a driver 21a and a receiver 21b. The driver 21a includes an NMOS transistor. The receiver 21b includes an NMOS transistor and a PMOS transistor which constitute an inverter. A connection node N1 of the driver 21a and the receiver 21b is connected to the level shift circuit 32 via a signal line SL1. The I/O circuit 22 includes a receiver 22b. The receiver 22b includes an NMOS transistor and a PMOS transistor which constitute an inverter. A connection node N2 of a gate of the NMOS transistor and a gate of the PMOS transistor is connected to the level shift circuit 32 via a signal line SL2. A voltage VDD2 (power supply voltage) supplied to the I/O circuits 21 and 22 is 3.3 V.

The core unit 23 receives a signal via the I/O circuits 21 and 22 and performs predetermined control according to the received signal. For example, when the core unit 23 receives a write command and data via the I/O circuits 21 and 22, the core unit 23 writes the data to the nonvolatile memory 10 according to the write command. In addition, the core unit 23 outputs a signal via the I/O circuits 21 and 22 according to predetermined control. For example, when the core unit 23 receives a read command via the I/O circuits 21 and 22, the core unit 23 reads data from the NAND flash memory 10 and outputs the read data via the I/O circuits 21 and 22.

The memory system 1 transmits and receives a high-speed differential signal (TX, RX) conforming to the PCIe standard to and from the host device 100 via the PCIe interface 4. In addition, the memory system 1 transmits and receive a control signal necessary for the operation of the memory system 1 to and from the host device 100 via the PCIe interface 4. Examples of the control signal are logic signals such as the clock request signal CLKREQ #, the wakeup signal PEWAKE #and the reset signal PERST #shown in FIG. 2. The clock request signal CLKREQ #is input to one pin in the port DP1. The wakeup signal PEWAKE #is input to one pin in the port DP2. The reset signal PERST #is input to one pin in the port DP3.

The clock request signal CLKREQ #is a signal for requesting a clock generator (not shown) to supply a reference clock signal. The clock generator is disposed outside or inside the host device 100. The wakeup signal PEWAKE #is a signal transmitted from the host device 100 to the memory system 1 when the host device 100 activates the memory system 1. The reset signal PERST #is a signal transmitted from the host device 100 to the memory system 1 when the host device 100 initializes the memory system 1.

A voltage VDD1 of the logic signals such as the clock request signal CLKREQ #, the reference clock signal REFCLK and the reset signal PERST #is currently 3.3 V. Note that the voltage VDD1 will be 1.8 V later.

When the voltage VDD1 is scheduled to switch from 3.3 V to 1.8 V during the mass production of the SSD, in order to handle the switching, for example, it is necessary to prepare a board for 3.3 V and a board for 1.8 V or prepare a board and mount a selection jumper or the like according to voltage.

In the present embodiment, in order to handle the switching from 3.3 V to 1.8 V, the interface circuit 30 in the memory system 1 of the present embodiment includes the voltage automatic switching circuit 31. The voltage automatic switching circuit 31 is connected to the port UP4, and the port UP4 is connected to the port DP4 of the host device 100.

When the voltage VDD1 is 1.8 V, a pin for transmitting a VIO 1.8 V signal (a first signal) is provided in the port DP4 of the host device 100. As a result, the VIO 1.8 V signal is input from the controller 102 of the host device 100 to the voltage automatic switching circuit 31 via the port DP4 and the part UP4.

On the other hand, when the voltage VDD1 is 3.3 V, a pin for transmitting the VIO 1.8 V signal is not provided in the port DP4 of the host device 100. As a result, the VIO 1.8 V signal is not input to the voltage automatic switching circuit 31.

When the VIO 1.8 V signal is input to the voltage automatic switching circuit 31, the voltage automatic switching circuit 31 outputs a first output signal having a voltage of 1.8 V. On the other hand, when the VIO 1.8 V signal is not input to the voltage automatic switching circuit 31, the voltage automatic switching circuit 31 outputs a second output signal having a voltage of 3.3 V. As described above, in the present embodiment, the voltage automatic switching circuit 31 outputs output a signal having a different voltage (the first output signal, the second output signal) based on whether or not the VIO 1.8 V signal is input. In the present embodiment, the first output signal is lower than the second output signal.

The first output signal or the second output signal is input from the voltage automatic switching circuit 31 to the level shift circuit 32. When the first output signal is input, the level shift circuit 32 converts the voltage of the input logic signal (CLKREQ #, PEWAKE #, PERST #) from 1.8 V into 3.3 V. On the other hand, when the second output signal is input, the level shift circuit 32 does not convert the voltage of the input logic signal (CLKREQ #, PEWAKE #, PERST #).

Figure 4:
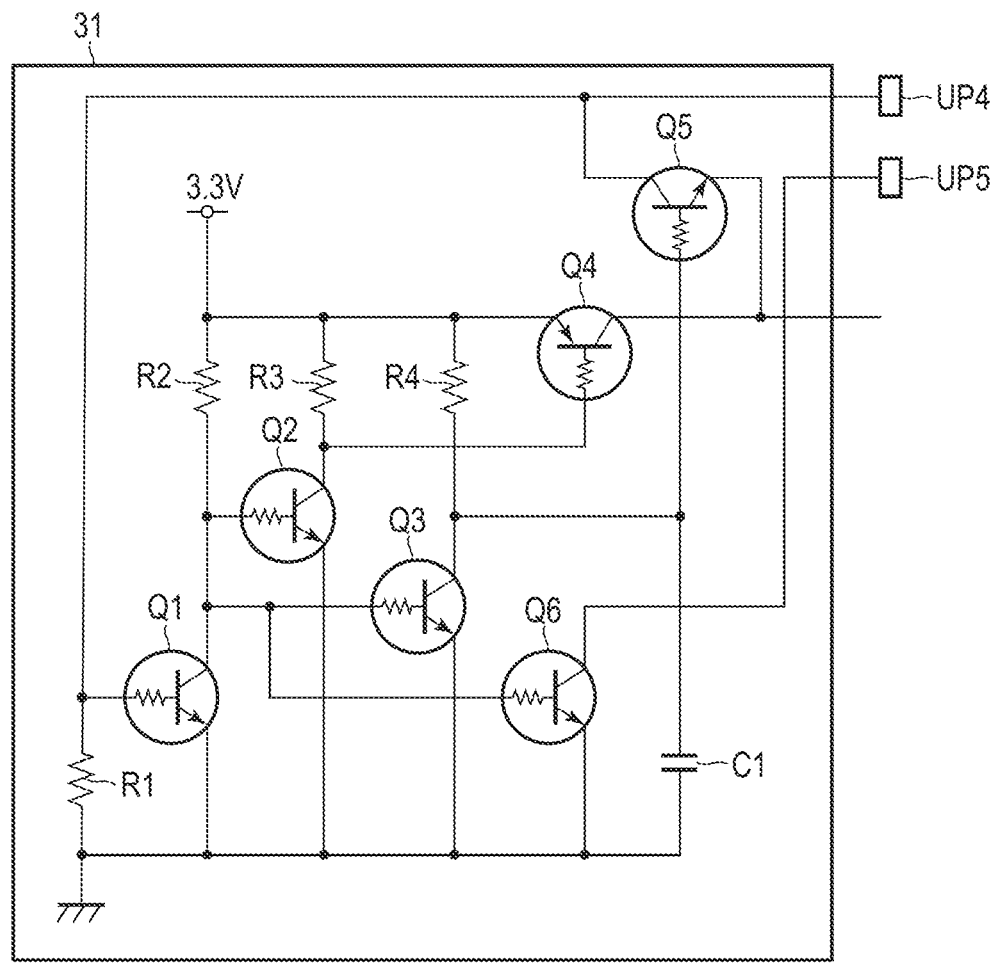
FIG. 4 is a circuit diagram of an automatic power supply automatic switching circuit of the memory system according to one embodiment.

FIG. 4 is a circuit diagram of the voltage automatic switching circuit 31. The voltage automatic switching circuit 31 includes bipolar transistors Q1 to Q6, resistors R1 to R4 and a capacitor C1. The bipolar transistors Q1 to Q3, Q5 and Q6 are NPN bipolar transistors, and the bipolar transistor Q4 is a PNP bipolar transistor.

A base of the bipolar transistor Q1 is connected to a ground via the resistor R1 and is connected to a collector of the bipolar transistor Q5.

A collector of the bipolar transistor Q1 is connected to a power supply voltage of 3.3 V via the resistor R2 and is connected to bases of the bipolar transistors Q2, Q3 and Q6. An emitter of the bipolar transistor Q1 is connected to the ground and is connected to emitters of the bipolar transistors Q2, Q3 and Q6, and capacitor C1.

Note that the capacitor C1 is provided for adjusting a timing when the bipolar transistor Q5 is set to an on state, and is not necessarily required.

A collector of the bipolar transistor Q2 is connected to the power supply voltage of 3.3 V via the resistor R3 and is connected to a base of the bipolar transistor Q4.

A collector of the bipolar transistor Q3 is connected to the power supply voltage of 3.3 V via the resistor R4, is connected to the ground via the capacitor C1, and is connected to a base of the bipolar transistor Q5.

A collector of the bipolar transistor Q4 is connected to an emitter of the bipolar transistor Q5.

In addition, an emitter of the bipolar transistor Q4 is connected to the power supply voltage of 3.3 V.

A collector of the bipolar transistor Q5 is connected to a pin in the port UP4 to which the VIO 1.8 V signal is output.

A collector of the bipolar transistor Q6 is connected to a pin which is in the port UP5 and outputs a VIO signal.

When the logic signal is 3.3 V, the port UP4 of the memory system 1 includes a pin for transmitting the VIO 1.8 V signal but the port DP4 of the host device 100 does not include a pin for transmitting the VIO 1.8 V signal. Therefore, the port UP4 is set to an unconnected open state (Not Connected), the base of the bipolar transistor Q1 is set to a ground (GND) level by the resistor R1 connected to the base of the bipolar transistor Q1, and thus the bipolar transistor Q1 is set to an off state.

As a result, the bipolar transistors Q2, Q3, Q4 and Q6 are set to an on state, and the output voltage is 3.3 V.

When the logic signal is 3.3 V, a collector current of the bipolar transistor Q6 can be used as the VIO CFG signal. The VIO CFG signal is a signal for informing the host device 100 that the logic signal of the memory system 1 is 3.3 V, and indicates that the logic signal of the memory system 1 is 3.3 V when the signal is the ground level. In this case, a pin for transmitting the VIO CFG signal is provided in the port UP5 of the memory system 1.

When the logic signal is 1.8 V, the port UP4 and the port DP4 each include a pin for transmitting the VIO 1.8 V signal. Therefore, the VIO 1.8 V signal is input to the base of the bipolar transistor Q1 and the collector of the bipolar transistor Q5, and thus the bipolar transistor Q1 is set to an on state. As a result, the bipolar transistors Q2, Q3, Q4 and Q6 are set to an on state, the bipolar transistor Q5 is set to an on state via the resistor 4, and an output voltage is 1.8 V.

Figure 5:
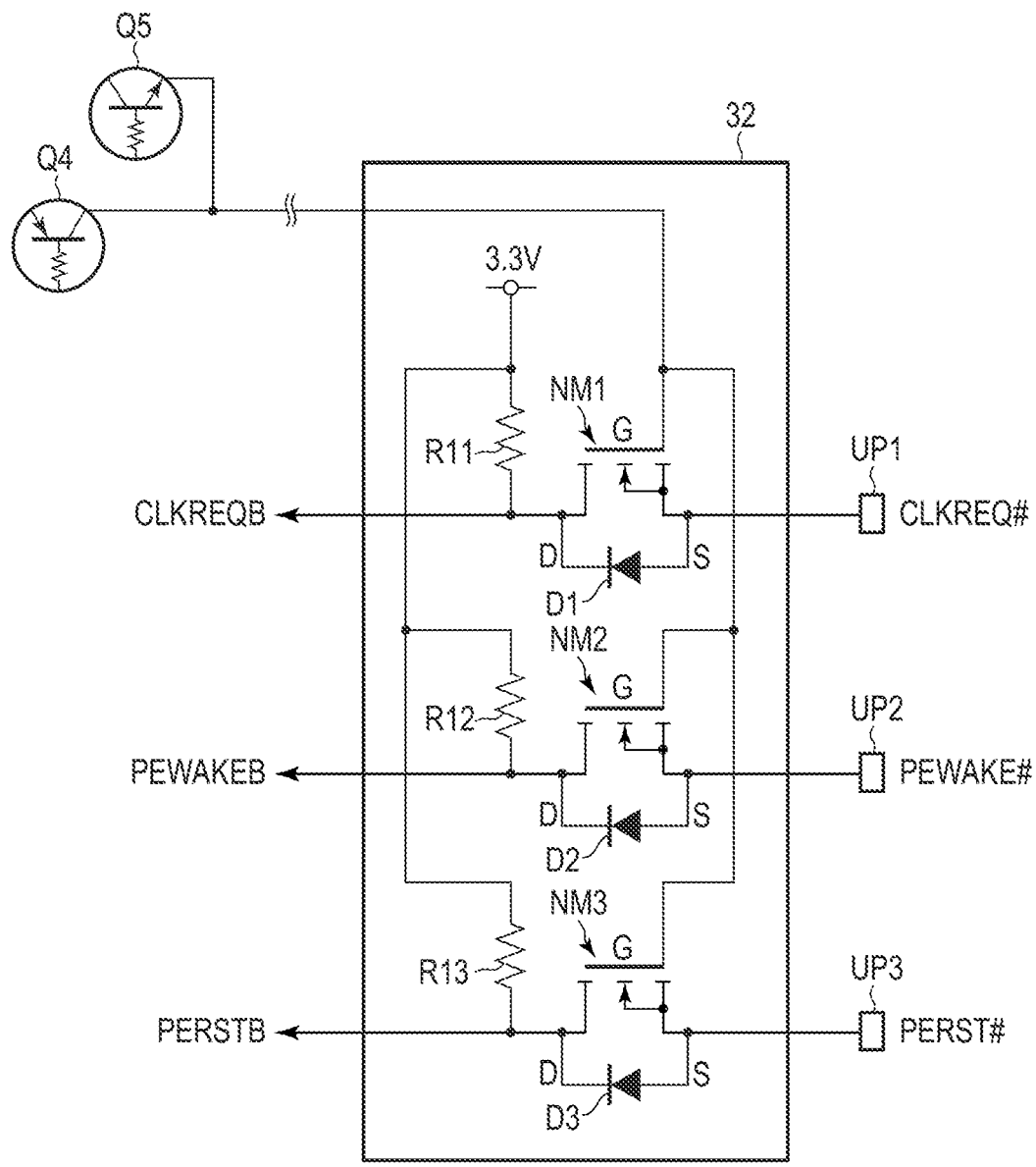
FIG. 5 is a circuit diagram of a level shift circuit of the memory system according to one embodiment.

FIG. 5 is a circuit diagram of the level shift circuit 32. This circuit diagram is of a case where the voltage automatic switching circuit 31 of FIG. 4 is used.

The level shift circuit 32 includes an NMOS transistor NM1, an NMOS transistor NM2 and an NMOS transistor NM3, and a pull-up resister R11, a pull-up resistor R12 and a pull-up resistor R13.

A gate of the NMOS transistor NM1 is connected to the collector of the bipolar transistor Q4 and the emitter of the bipolar transistor Q5. A source S of the NMOS transistor NM1 is connected to the pin in the port DP1 to which the clock request signal CLKREQ #is supplied. A drain D of the NMOS transistor NM1 is connected to one end of the pull-up resistor R11. Another end of the pull-up resistor R11 is connected to the power supply voltage of 3.3 V. The drain D outputs a clock request signal CLKREQB as an output. The letter "B" indicates a signal used as a low active signal. A parasitic diode D1 is present between the source S and the drain D of the NMOS transistor NM1. An anode and a cathode of the parasitic diode D1 are connected to the source S and the drain D, respectively.

The clock request signals CLKREQ #and CLKREQB are bidirectional signals, a low signal from a pin for the clock request signal CLKREQB in the port UP1 reduces a potential of the source S of the NMOS transistor NM1 through the parasitic diode D1, and causes a potential difference between the gate G and the source S. As a result, the NMOS transistor NM1 is set to an on state, the low signal is transmitted to the pin for the clock request signal CLKREQ #in the port DP1.

A gate of the NMOS transistor NM2 is connected to the collector of the bipolar transistor Q4 and the emitter of the bipolar transistor Q5. A source S of the NMOS transistor NM2 is connected to the pin in the port DP2 to which the wakeup signal PEWAKE #is supplied. A drain D of the NMOS transistor NM2 is connected to one end of the pull-up resistor R12. Another end of the pull-up resistor R12 is connected to the power supply voltage of 3.3 V. The drain D outputs a wakeup signal PEWAKEB as an output. A parasitic diode D2 is present between the source S and the drain D of the NMOS transistor NM2. An anode and a cathode of the parasitic diode D2 are connected to the source S and the drain D, respectively. The wakeup signals PEWAKE #and PEWAKEB are bidirectional signals, and a low signal from the wakeup signal PEWAKEB reduces a potential of the source S of the NMOS transistor NM2 through the parasitic diode D2. As a result, a potential difference is caused between the gate G and the source S of the NMOS transistor NM2, the NMOS transistor NM2 is set to an on state, and thus the low signal is transmitted to the port UP2.

The wakeup signals PEWAKE #and PEWAKEB are bidirectional signals, a low signal from a pin for the PEWAKEB in the port UP2 reduces a potential of the source S of the NMOS transistor NM2 through the parasitic diode D2, and causes a potential difference between the gate G and the source S. As a result, the NMOS transistor NM2 is set to an on state, and the low signal is transmitted to the pin for the wakeup signal PEWAKE #in the port DP2.

A gate of the NMOS transistor NM3 is connected to the collector of the bipolar transistor Q4 and the emitter of the bipolar transistor Q5. A source S of the NMOS transistor NM3 is connected to the pin in the port DP3 to which the reset signal PERST #is supplied. A drain D of the NMOS transistor NM3 is connected to one end of the pull-up resistor R13. Another end of the pull-up resistor R13 is connected to the power supply voltage of 3.3 V. The drain D outputs a reset signal PERSTB as an output. A parasitic diode D3 is present between the source S and the drain D of the NMOS transistor NM3. An anode and a cathode of the parasitic diode D3 are connected to the source S and the drain D, respectively.

When the logic signal is 3.3 V, the bipolar transistor Q4 is in an on state, and the bipolar transistor Q4 is in an off state. An output voltage of the bipolar transistor Q4 in an on state is 3.3 V. This output voltage is input to the gates of the NMOS transistors NM1 to NM3.

As a result, when the logic signal is 3.3 V, the clock request signal CLKREQ #of 3.3 V input to the source S of the NMOS transistor NM1 is output from the drain D of the NMOS transistor NM1 as the clock request signal CLKREQB of 3.3 V by the pull-up resistor R11 connected to the drain D of the NMOS transistor NM1. The wakeup signal PEWAKE #of 3.3 V input to the source S of the NMOS transistor NM2 is output from the drain D of the NMOS transistor NM2 as the wakeup signal PEWAKEB of 3.3 V without voltage conversion. The reset signal PERST #of 3.3 V input to the source S of the NMOST transistor NM3 is output from the drain D of the NMOS transistor NM3 as the reset signal PERSTB of 3.3 V without voltage conversion. The clock request signal CLKREQB and the wakeup signal PEWAKEB are input to the output node N1 of the I/O circuit 21. In addition, the reset signal PERSTB is input to the node N2 of the I/O circuit 22.

On the other hand, when the logic signal is 1.8 V, the bipolar transistor Q4 is in an off state, and the bipolar transistor Q5 is in an on state. An output voltage of the bipolar transistor Q5 in an on state is 1.8 V. This output voltage is input to the gates of the NMOS transistors NM1 to NM3.

As a result, when the logic signal is 1.8 V, the clock request signal CLKREQ #of 1.8 V input to the source S of the NMOS transistor NM1 is output from the drain D of the NMOS transistor NM1 as the clock request signal CLKREQB of 3.3 V pulled up by the pull-up resistor R11. The wakeup signal PEWAKE #of 1.8 V input to the source S of the NMOS transistor NM2 is output from the drain D of the NMOS transistor NM2 as the wakeup signal PEWAKEB of 3.3 V pulled up by the pull-up resistor R12. The reset signal PERST #of 1.8 V input to the source S of the NMOS transistor NM3 is output from the drain D of the NMOS transistor NM3 as the reset signal PERSTB of 3.3 V pulled up by the pull-up resistor R13.

Figure 6:
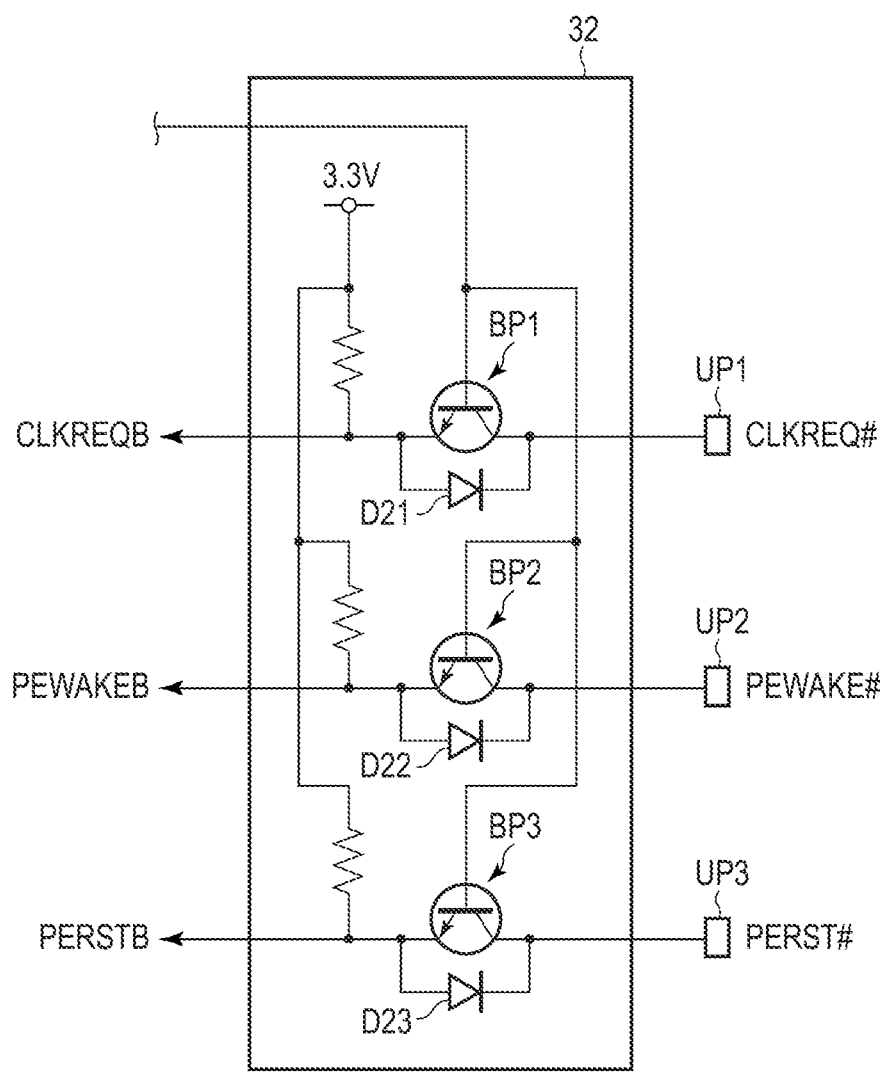
FIG. 6 is a circuit diagram of another level shift circuit of the memory system according to one embodiment.

In the above-described embodiment, the voltage automatic switching circuit 31 and the level shift circuit 32 are disposed inside the interface circuit 30. However, the voltage automatic switching circuit 31 and the level shift circuit 32 may be disposed outside the interface circuit 30. Although the NMOS transistors MN1 to MN3 are used in FIG. 5, a level shift circuit using bipolar transistors BP1 to BP3 may be used as shown in FIG. 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host device comprising:
a nonvolatile memory;
a controller configured to control the nonvolatile memory and to which a first voltage is supplied; and
a circuit configured to output to the controller, in a first case where a first signal and a second signal are input from the host device in a state where the memory system is connected to the host device, the first and second signals both having a second voltage that is lower than the first voltage, a third signal having the first voltage based on the second signal having the second voltage, and configured to output to the controller, in a second case where the first signal is not input and the second signal is input from the host device, the second signal having the first voltage, a fourth signal having the first voltage based on the second signal having the first voltage.

2. The memory system of claim 1, wherein the circuit includes a first circuit, and an output of the first circuit is at a first state in the first case, and the output of the first circuit is at a second state in the second case, the second state being different from the first state.

3. The memory system of claim 2, wherein the circuit includes a second circuit, and the second circuit is configured to output the third signal when the output of the first circuit is at the first state.

4. The memory system of claim 3, wherein the second circuit is configured to output the fourth signal when the output of the first circuit is at the second state.

5. The memory system of claim 1, further comprising a connector connectable to the host device,
wherein:
the connector includes a first pin and a second pin,
the first and second pins are connected to the circuit, and
the first signal is configured to be input to the first pin and the second signal is configured to be input to the second pin.

6. The memory system of claim 5, wherein the connector has a shape which conforms to an M.2 standard.

7. The memory system of claim 1, wherein
a signal transmission and reception between the memory system and the host device is performed in conformity with a PCIe standard,
the first signal is a VIO 1.8 V signal,
the second signal is a clock request signal CLKREQ #, a wakeup signal PEWAKE #or a reset signal PERST #.

8. The memory system of claim 7, wherein the circuit outputs a VIO CFG signal when the first signal is not input to the circuit.

9. The memory system of claim 1, wherein the circuit comprises a transistor, and is configured to output the second signal that has transmitted through the transistor as the third signal or the fourth signal.

10. The memory system of claim 1, further comprising a board, wherein the nonvolatile memory, the controller, and the circuit are mounted on the board.

11. The memory system of claim 1, wherein the first voltage is 3.3 volts and the second voltage is 1.8 volts.

* * * * *